United States Patent [19]

Turner

[11] Patent Number: 5,192,360

[45] Date of Patent: Mar. 9, 1993

[54] WATER-SOLUBLE FLUX FOR CORED SOLDER

[75] Inventor: Raymond L. Turner, La Habra, Calif.

[73] Assignee: Hughes Aircraft Company, Los Angeles, Calif.

[21] Appl. No.: 708,961

[22] Filed: May 31, 1991

Related U.S. Application Data

[63] Continuation-in-part of Ser. No. 607,200, Oct. 31, 1990, abandoned, which is a continuation-in-part of Ser. No. 523,765, May 15, 1990.

[51] Int. Cl.⁵ .............................................. B23K 35/34
[52] U.S. Cl. ........................................ 75/303; 75/304; 148/23; 106/287.24
[58] Field of Search ................... 75/303, 304; 148/21, 148/22, 23, 25; 106/287.24

[56] References Cited

U.S. PATENT DOCUMENTS

| | | | |
|---|---|---|---|
| 1,402,644 | 1/1922 | Passalacqua | 148/23 |
| 1,805,458 | 5/1931 | Rogers | 106/244 |
| 3,020,635 | 2/1962 | Redgrift | 228/223 |
| 3,091,029 | 5/1963 | Davis | 228/224 |
| 3,162,547 | 12/1964 | Kendall | 134/3 |
| 3,220,892 | 11/1965 | Durham, Jr. | 148/23 |
| 3,305,406 | 2/1967 | Chmelick et al. | 148/23 |
| 3,684,533 | 8/1972 | Conwicke | 148/24 |
| 3,925,112 | 12/1975 | Petersen, Sr. et al. | 148/25 |
| 3,966,632 | 6/1976 | Colliopoulos et al. | 106/244 |
| 4,073,412 | 2/1978 | Doumani | 106/244 |
| 4,113,525 | 9/1978 | Stayner | 148/23 |
| 4,290,824 | 9/1981 | Cole | 148/23 |
| 4,342,606 | 8/1982 | Notton | 148/25 |
| 4,342,606 | 8/1982 | Notton | 148/23 |
| 4,342,607 | 8/1982 | Zado | 148/23 |
| 4,460,427 | 7/1984 | Haney et al. | 427/98 |
| 4,478,650 | 10/1984 | Zado | 148/23 |
| 4,568,395 | 2/1986 | Nabhani | 148/23 |
| 4,738,732 | 4/1988 | Anderson et al. | 148/23 |
| 4,759,490 | 7/1988 | Ochiai | 148/24 |
| 4,809,901 | 3/1989 | Gen et al. | 148/23 |
| 4,821,948 | 4/1989 | Fisher et al. | 228/223 |
| 4,872,928 | 10/1989 | Jacobs | 148/24 |
| 4,895,606 | 1/1990 | Jafri | 148/25 |
| 4,963,401 | 12/1990 | Kaspaul | 148/25 |
| 4,988,395 | 1/1991 | Taguchi et al. | 148/25 |

FOREIGN PATENT DOCUMENTS

| | | |
|---|---|---|
| 090960 | 3/1983 | European Pat. Off. . |
| 2052713 | 10/1970 | Fed. Rep. of Germany . |
| 104106 | 3/1922 | France . |
| 460965 | 4/1975 | U.S.S.R. ............... 148/23 |
| 2080341 | 7/1980 | United Kingdom . |
| 8703783 | 7/1987 | World Int. Prop. O. .......... 106/244 |

OTHER PUBLICATIONS

Weast, R. C., "CRC Handbook of Chemistry and Physics", CRC Press, Inc. Boca Raton, Fla. 1984; pp. D-222, D-229.
Patent Abstracts of Japan, vol. 11, No. 175 (M-596)[2622], Jun. 5, 1987; & unexamined Japanese Patent Publication No. 62-6796 (including translation).
Soviet Inventions Illustrated, week 8747, Dec. 2, 1987, abstract no. 333423, Derwent Publications Ltd., London GB; SU-A-1 303 341 (A. I. Bulatov) Apr. 15, 1987.

*Primary Examiner*—Theodore Morris
*Assistant Examiner*—David M. Brunsman
*Attorney, Agent, or Firm*—William C. Daubenspeck; Wanda K. Denson-Low

[57] ABSTRACT

A non-toxic, non-corrosive water-soluble flux for cored solders comprises citric acid. The flux of the invention produces solder joints of high metallic luster and excellent quality. Clean-up of flux residues is accomplished using only water.

12 Claims, No Drawings

WATER-SOLUBLE FLUX FOR CORED SOLDER

CROSS-REFERENCE TO RELATED APPLICATIONS

The present application is a continuation-in-part application of Ser. No. 07/607,200 now abandoned filed Oct. 31, 1990, which in turn is a continuation-in-part application of Ser. No. 07/523,765, now U.S. Pat. No. 5,085,356 filed May 15, 1990, both prior applications filed in the name of Ray L. Turner and assigned to the same assignee as the present application.

The applications disclose and claim a method of soldering using a water-soluble flux which contains a water-soluble organic acid having at least two carboxylic acid groups. A preferred example of such an organic acid is citric acid.

The present application is also related to applications bearing Ser. Nos. 07/608,041 and 07/607,199 now abandoned, both applications also filed on Oct. 31, 1990, and assigned to the same assignee as the present application. The former application discloses and claims a composition of matter useful as a solder paste and a method for using the same; the latter application discloses and claims a composition of matter useful as a cored solder flux and a method for using the same.

TECHNICAL FIELD

The present invention relates to a novel water-soluble, environmentally-safe flux for cored solders, primarily useful in electronic industry soldering processes.

BACKGROUND ART

Most fluxes and defluxing chemicals used by industry to manufacture electronic circuits, such as military hardware, are either contributing to ozone depletion of the atmosphere or are considered by local environmental agencies, such as the Air Quality Management District in the Los Angeles basin, as environmental pollutants or health hazards. For example, it has been reported that if CFCs (chlorofluorohydrocarbons), which are used in vapor degreasing to clean soldered parts where a rosin flux is employed, are released to the atmosphere, they will remain there as an ozone depletant for nearly 100 years. Other chemicals such as rosin fluxes, alcohols, and the like pose health risks and disposal problems for industry.

Water-soluble fluxes for cored solders are formulations that combine a soldering flux with a thickening agent maintained within a hollow tube of solder.

What is desired is a simple, non-toxic, non-corrosive, environmentally-safe solder flux for cored solders that produces solder joints of high metallic luster and excellent quality.

DISCLOSURE OF INVENTION

In accordance with the invention, a water-soluble flux for cored solder is provided, comprising citric acid. The citric acid is co-extruded with a hollow cylinder of solder to form the composite cored solder.

The flux of the invention eliminates harmful environmental emissions normally associated with rosin-based fluxes, flux thinner (such as iso-propanol), and associated defluxing solvents (such as CFCs). The flux of the invention is environmentally safe, non-toxic, and easy to use. Soldered assemblies can be cleaned in deionized water, thus eliminating the high capital costs associated with vapor degreasing equipment. The resulting soldered joint exhibits high metallic luster and excellent electrical quality.

BEST MODES FOR CARRYING OUT THE INVENTION

The flux of the invention comprises citric acid. Citric acid has a melting point of about 149° C. The inventors have found that in the liquidous state, citric acid can be co-extruded with any of the common tin-based solders.

Citric acid granules or crystals are heated to a liquid state (approximately 149°) in a stainless steel container. The heated liquid citric acid is then poured into a pressurized heated extruding vat. As the solid solder wire is extruded into a hollow cored wire, the liquid citric acid is fed into the extruding chamber and then into the core. Air pressure inside the vat is preferably adjusted to assure void-free extrusion inside the core. The extruded, flux-filled solder wire is then wound on spools, labeled, and packaged for use.

Without subscribing to any particular theory, it appears that the citric acid chelates the oxide of the basis metal, but not the metal itself. As a result, there is little or no corrosion of the basis metal by the flux of the invention.

The grade or class of the citric acid is not critical in the practice of the invention. However, for extremely sensitive electrical circuits, it may be desirable to employ a fairly high grade of citric acid.

The flux may contain other components, such as impurities, whether accidental or deliberate, so long as such additives have no adverse effect on the soldering results.

Any of the common tin-based soldering alloys may be employed, including 60/40 Sn/Pb, 62/2/36 Sn/Ag/Pb, 63/37 Sn/Pb, and 96/4 Sn/Ag. Typically, 60/40 and 63/37 tin-lead solders are used.

The flux/cored solder is most advantageously employed in surface mounted and through hole mounted component soldering processes. The flux contains no volatile organic compounds (VOCs) or other evaporative solvents, such as iso-propyl alcohol. The water-soluble solder flux of the invention avoids the use of rosin-cored solders, which necessitate the use of chlorofluorocarbon-type defluxing agents; rather, the flux of the invention is easily defluxed using deionized water.

The flux of the invention provides the following advantages:

1. It eliminates harmful environmental emissions normally associated with rosin-cored fluxes, flux thinner (such as iso-propyl alcohol), and associated defluxing agents (such as 1,1,1-trichloroethane). Indeed, cleaning of the flux is simply done in warm or hot water. Thus, the new flux is environmentally safe.

2. It provides soldering personnel with a nontoxic, extremely safe, and highly effective flux/cored solder to use.

3. Its use provides solder joints that evidence a more lustrous connection with excellent wetting and an estimated 80% reduction in solder defects, compared with rosin-cored solders.

INDUSTRIAL APPLICABILITY

The flux/cored solder of the invention is expected to find use in commercial soldering operations, particularly in soldering electrical components in circuit boards.

EXAMPLE

Five electronic assembly personnel conducted a hand soldering operation comparing solder wire cored using Mil-Spec rosin flux to that employing citric acid. A total of 280 solder joints were made. The solder joints (connections) involved the insertion of the leads of dual in-line packages (DIPs) into plated-through holes on printed wiring boards. Following component (DIP) installation, each assembler performed the soldering/flux comparison using both types of flux cored solder. Following the evaluation, the five assemblers jointly concluded that the solder wire comprising citric acid produced solder joints superior in quality and luster to those of rosin cored solder. Both types of solder wire were of the same solder composition, Sn 63/Pb 37.

Thus, there has been disclosed a non-toxic, non-corrosive, environmentally-safe, water-soluble flux for cored solders, suitable for use in soldering electrical components. It will be clear to those skilled in the art that various changes and modifications of an obvious nature may be made, and all such changes and modifications are considered to fall within the scope of the invention, as defined by the appended claims.

What is claimed is:

1. A composite cored solder comprising a hollow cylinder of solder, said hollow filled with flux, said flux comprising citric acid.

2. A composite cored solder of claim 1 wherein said solder consists essentially of a tin-based solder.

3. A composite cored solder of claim 2 wherein said solder consists essentially of a tin-lead solder.

4. A composite cored solder comprising a hollow cylinder of solder, said hollow filled with flux, said flux consisting essentially of citric acid.

5. A composite cored solder of claim 4 wherein said solder consists essentially of a tin-based solder.

6. A composite cored solder of claim 5 wherein said solder consists essentially of a tin-lead solder.

7. A method of soldering a metal comprising applying to a surface thereof a cored solder containing a flux therein and heating said metal to a desired soldering temperature, characterized in that said soldering flux comprises citric acid.

8. The method of claim 7 wherein said solder consists essentially of a tin-based solder.

9. The method of claim 8 wherein said solder consists essentially of a tin-lead solder.

10. A method of soldering a metal comprising applying to a surface thereof a cored solder containing a flux therein and heating said metal to a desired soldering temperature, characterized in that said soldering flux consists essentially of citric acid.

11. The method of claim 10 wherein said solder comprising a tin-based solder.

12. The method of claim 11 wherein said solder consists essentially of a tin-lead solder.

* * * * *